United States Patent
Bono et al.

(10) Patent No.: US 11,075,192 B2
(45) Date of Patent: Jul. 27, 2021

(54) MICROELECTRONIC DIODE WITH OPTIMISED ACTIVE SURFACE

(71) Applicant: COMMISSARIAT A L'ENERGIE ATOMIQUE ET AUX ENERGIES ALTERNATIVES, Paris (FR)

(72) Inventors: Hubert Bono, Grenoble (FR); Jonathan Garcia, Monestier du Percy (FR); Ivan-Christophe Robin, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/769,962

(22) PCT Filed: Oct. 20, 2016

(86) PCT No.: PCT/EP2016/075199
§ 371 (c)(1),
(2) Date: Apr. 20, 2018

(87) PCT Pub. No.: WO2017/068029
PCT Pub. Date: Apr. 27, 2017

(65) Prior Publication Data
US 2018/0315738 A1    Nov. 1, 2018

(30) Foreign Application Priority Data
Oct. 22, 2015   (FR) ..................... 15 60077

(51) Int. Cl.
*H01L 25/075*    (2006.01)
*H01L 27/15*    (2006.01)
(Continued)

(52) U.S. Cl.
CPC ........ *H01L 25/0753* (2013.01); *H01L 27/156* (2013.01); *H01L 33/0093* (2020.05);
(Continued)

(58) Field of Classification Search
CPC ............... H01L 25/0753; H01L 27/156; H01L 33/0079; H01L 33/0093; H01L 33/385; H01L 2933/0016
See application file for complete search history.

(56) References Cited

U.S. PATENT DOCUMENTS 7,564,069 B2 *   7/2009   Shei ................... H01L 33/0079
                                                    257/94
8,716,723 B2 *   5/2014   Chen ....................... H01L 33/08
                                                    257/88
(Continued)

FOREIGN PATENT DOCUMENTS

EP    2 408 029 A2   1/2012
EP    2 865 021 B1   2/2017
(Continued)

OTHER PUBLICATIONS

International Search Report dated Jan. 4, 2017, in PCT/EP2016/075199 filed Oct. 20, 2016.
(Continued)

*Primary Examiner* — Andrew Q Tran
(74) *Attorney, Agent, or Firm* — Oblon, McClelland, Maier & Neustadt, L.L.P.

(57) ABSTRACT

A diode including: first and second doped semi-conductor portions forming a p-n junction, a first part of the first portion being arranged between a second part of the first portion and the second portion; dielectric portions covering side walls of the second portion and the first part of the first portion; a first electrode arranged against outer side walls of the dielectric portions and against side walls of the second
(Continued)

part of the first portion, electrically connected to the first portion only by contact with said side walls, and passing through the entire thickness of the first portion; a second optically reflecting electrode electrically connected to the second portion such that the second portion is arranged between the second electrode and the first portion.

18 Claims, 5 Drawing Sheets

(51) Int. Cl.
  *H01L 33/00* (2010.01)
  *H01L 33/38* (2010.01)
  *F21Y 115/10* (2016.01)
(52) U.S. Cl.
  CPC ......... *F21Y 2115/10* (2016.08); *H01L 33/385* (2013.01); *H01L 2933/0016* (2013.01)

(56) References Cited

U.S. PATENT DOCUMENTS

| | | |
|---|---|---|
| 2006/0214173 A1 | 9/2006 | Beeson et al. |
| 2009/0184337 A1 | 7/2009 | Fan et al. |
| 2012/0007133 A1 | 1/2012 | Cho et al. |
| 2014/0191279 A1 | 7/2014 | Cho et al. |
| 2014/0191280 A1 | 7/2014 | Cho et al. |
| 2015/0108514 A1 | 4/2015 | Shi et al. |
| 2015/0108534 A1* | 4/2015 | Zeng .................... H01L 33/145 257/99 |
| 2015/0187990 A1* | 7/2015 | Yin ........................ H01L 33/08 257/88 |
| 2015/0252955 A1* | 9/2015 | Boschetto ............. F21V 23/002 362/249.02 |

FOREIGN PATENT DOCUMENTS

| | | |
|---|---|---|
| FR | 2 992 465 A1 | 12/2013 |
| KR | 10-2009-0011372 A | 2/2009 |
| WO | WO 2014/105403 A1 | 7/2014 |

OTHER PUBLICATIONS

French Search Report dated Aug. 23, 2016, in French Application 15 60077 filed Oct. 22, 2015.
Martinez, M. et al., "Mechanisms of copper direct bonding observed by in-situ and quantitative transmission electron microscopy", Thin Solid Films, vol. 530, (2013). pp. 96-99.
U.S. Appl. No. 14/409,640, filed Dec. 19, 2014, 2015/0148213 A1, Chezaud, D. et al.
U.S. Appl. No. 14/779,516, filed Mar. 25, 2014, 2016/0049544 A1, Robin, I.C. et al.
U.S. Appl. No. 14/913,254, filed Aug. 21, 2014, 2016/0204307 A1, Robin, I.C. et al.
U.S. Appl. No. 15/031,992, filed Oct. 24, 2014, 2016/0276328 A1, Robin, I.C. et al.
U.S. Appl. No. 15/031,963, filed Oct. 24, 2014, 2016/0270176 A1, Robin, I.C. et al.
U.S. Appl. No. 15/129,428, filed Mar. 26, 2015, 2017/0173597 A1, Feraud, J-P et al.
U.S. Appl. No. 15/744,549, filed Jan. 12, 2018, Boisnier, B.
European Office Action dated Apr. 3. 2020 in European Patent Application No. 16 785 124.5, citing document AO therein, 7 pages.

* cited by examiner

MICROELECTRONIC DIODE WITH OPTIMISED ACTIVE SURFACE

TECHNICAL FIELD AND PRIOR ART

The invention relates to the field of light-emitting diodes such as electroluminescent diodes (called LEDs or micro-LEDs), in addition to that of light-receiving diodes such as photodiodes. The invention in particular applies to the field of LED lighting devices, electronic light-emitting devices comprising LED arrays such as screens, projectors or video walls, in addition to the field of electronic or microelectronic light-receiving devices comprising photodiode arrays, such as image sensors.

The production of diodes, for example when producing a photodiode or LED array forming a pixel array, is generally based on standard microelectronic methods commonly used in so-called planar technology and during which each element of the diodes is produced by a first deposition step, followed by a lithography step, then an etching step. Using this type of method, the production of each pattern of a material of the diodes requires the implementation of at least three separate steps. Moreover, each pattern produced must be aligned with those already present. Finally, the definition of each pattern must take into account the performance levels of the equipment concerned, both in terms of achievable dimensions and performance levels of the alignment relative to the previous pattern.

Furthermore, in order to achieve sufficient performance levels using standard microelectronic technology, the elements produced must undergo planarisation in order to control the lithography steps implemented on said elements, since the achievable resolution using such a lithography step is directly linked to the topography on which the lithography is implemented, whereby the ultra-fast lenses used in lithographic exposure devices have depths of field that are reduced with the increase in resolution.

In a standard diode array, deposition, lithography and etching steps are successively implemented to produce the electrical contacts (anodes and cathodes) of the diodes, as well as the electrical insulation layers between said electrical contacts. However, control of the electrical insulation between the cathode and the anode of each of the diodes is essential. The production of the electrical insulation between the electrodes of the diodes via the production of insulating layers deposited in accordance with the patterns of the structure causes a significant loss of available active surface area (corresponding to the surface area occupied by the diode elements producing the photoelectric conversion or light emission, i.e. the p-n junction of the diode) relative to the total available surface area on which the diode array is produced, given the surface area occupied by said electrical insulating layers.

In document FR 2 992 465 A, an LED device is produced from a stack of pre-structured semi-conductor layers in the form of independent islands, each island being used to produce one LED of the device. The surface area occupied by each of the LEDs is therefore predefined and the deposition, lithography and etching steps implemented do not allow for the minimisation of the loss of active surface area caused by the use of islands, the dimensions of which, in the plane of the substrate, do not correspond to those of the p-n junctions to be produced. The production of the anode of each LED comprises the etching of an opening in a dielectric layer previously deposited on the p-type semi-conductor. In order to ensure a good geometric definition of said electrode, said opening must be made by dry plasma-enhanced etching.

However, the InGaN used to produce said device is a wide band gap semi-conductor that is altered by this type of etching, which results in a poor electrical interface and therefore in irreversible deterioration of the electrical properties of the LEDs. Moreover, in this type of LED, the electrical contact between the cathode and the n-type semi-conductor is mainly obtained by the horizontal contact surface obtained by etching the semi-conductor island, which represents an additional loss of active surface area. Furthermore, numerous lithography steps must be implemented to complete the device. Finally, the n-type semi-conductor portions forming the horizontal electrical contact surfaces on which the cathodes are arranged cause light losses on the sides of the LEDs as a part of the light is guided horizontally by said semi-conductor portions and is lost in the environment surrounding the LED. The LEDs of said device have poor optical insulation relative to one another, which is detrimental to the resolution of the image obtained using said device.

DESCRIPTION OF THE INVENTION

One purpose of this invention is to propose a diode, the structure whereof minimises active surface losses in addition to lateral optical losses, while reducing the number of steps to be implemented for the production thereof in order to reduce the production cost thereof.

For this purpose, the invention proposes a diode comprising at least:
   a substrate;
   a first and second doped semi-conductor portions forming a p-n junction, the first semi-conductor portion being arranged between the substrate and the second semi-conductor portion;
   dielectric portions covering side walls of the second semi-conductor portion and a first part of the first semi-conductor portion;
   a first electrode resting on the substrate and arranged against the dielectric portions and against side walls of a second part of the first semi-conductor portion, which is arranged between the first part of the first semi-conductor portion and the substrate, the first electrode being electrically connected to the first semi-conductor portion only by contact with the side walls of the second part of the first semi-conductor portion;
   a second electrode electrically connected to the second semi-conductor portion such that the second semi-conductor portion is arranged between the second electrode and the first semi-conductor portion.

The invention further proposes a light-emitting diode or light-receiving diode, comprising at least:
   a first and second doped semi-conductor portions forming a p-n junction, a first part of the first semi-conductor portion being arranged between a second part of the first semi-conductor portion and the second semi-conductor portion;
   dielectric portions covering side walls of the second semi-conductor portion and the first part of the first semi-conductor portion;
   a first electrode arranged against the outer side walls of the dielectric portions and against side walls of the second part of the first semi-conductor portion, electrically connected to the first semi-conductor portion only by a contact with the side walls of the second part of the first semi-conductor portion, and passing through the entire thickness of the first semi-conductor portion;

a second optically reflecting electrode electrically connected to the second semi-conductor portion such that the second semi-conductor portion is arranged between the second electrode and the first semi-conductor portion;

and wherein a light is intended to be emitted or received by the diode through the first semi-conductor portion.

In said diode, the first electrode is electrically connected to the first semi-conductor portion only at the side walls of the second part of said portion. Therefore, unlike with diodes of the prior art, wherein a horizontal contact surface, i.e. a surface of contact that is substantially parallel to the main plane of the substrate, is produced by etching the semi-conductor, the fact of only using the side walls to produce said electrical contact maximally optimises the surface occupied by the diode and maximises the active surface area thereof. Moreover, this absence of any horizontal contact surface with the first semi-conductor portion prevents optical losses caused by a structure comprising such contact surfaces (since the dimensional differences, in the plane parallel to the substrate, between the different parts of the first semi-conductor portion are minimal), which improves the optical insulation of the diode and the light emission or conversion efficiency thereof.

Said diode uses dielectric portions, or electrical insulation portions, covering the side walls of a part of the elements forming the p-n junction of the diode and allowing the electrical insulation and passivation of said side walls, in particular with respect to the first electrode, in addition to the electrical insulation of the doped semi-conductor portions of the p-n junction relative to one another when not in direct contact with one another (in particular when one or more emitting layers are present between the first and second semi-conductor portions, or when an intrinsic semi-conductor portion is arranged therebetween). Said dielectric portions further ensure the electrical insulation between the first and the second electrodes by occupying a minimum amount of space in the diode. Said location of the dielectric portions on the side walls of the p-n junction of the diode, in addition to the production of the electrical contact between the first semi-conductor portion and the first electrode only via the side walls of a part of the first semi-conductor portion improves the ratio between the active surface area of the diode (surface occupied by the p-n junction) occupied on the substrate and the total surface area of the substrate on which the diode is produced, and therefore increases the integration of the diode on the substrate, given the low overall dimensions of the dielectric portions and of the first electrode, which each have a vertical structure (parallel to the side walls of the p-n junction of the diode which are covered by said dielectric portions and by the first electrode). This high integration allows, for example, an electronic display device to be produced, the pixels whereof have a lateral dimension of about 7 μm and are spaced apart by a distance of about 3 μm.

Furthermore, this high integration of the dielectric portions also has the advantage of minimising the current densities obtained in the electrodes of the diode, and thus of reducing the heating by Joule effect taking place in the diode via an overall reduction in the thermal resistance of the diode.

The structure of said diode results in reduced manufacturing costs thereof, in addition to reduced energy consumption. In the lighting field, such a diode improves the electrical injection within and thus increases the energy efficiency thereof. In the field of imaging devices, such a diode is used to produce high-resolution devices by reducing the size of the pixels, which becomes solely limited by the shaping means used.

The p-n junction formed by the first and second semi-conductor portions and the dielectric portions covering the side walls of the second semi-conductor portion and of the first part of the first semi-conductor portion can form a mesa structure. The expression "mesa structure" describes the fact that the diode is produced in the form of a stack of the first and second doped semi-conductor portions, a junction zone being present between said two doped semi-conductor portions, and the fact that said stack is, in this instance, etched over the entire height thereof in the form of an island called a mesa island. Moreover, said island comprises, at the side walls of the second part of the first doped semi-conductor portion, an electrical contact zone of the first doped semi-conductor portion to which the first electrode is connected.

Furthermore, the fact that the electrical contact between the first electrode and the first semi-conductor portion is made on the side walls of the second part of the first semi-conductor portion, the contact resistance, which is inversely proportional to the contact surface area, is completely independent from the width of the spaces separating the diodes and in which the first electrodes are arranged.

In said diode, the second electrode that is arranged on the side of the diode that is opposite that through which the light is intended to enter or leave the diode, is optically reflective. Therefore, the light enters or leaves the diode without having to pass through a transparent electrode, for example comprising ITO, which causes optical losses in the light emitted or received.

Moreover, given that the first electrode passes through the entire thickness of the first semi-conductor portion, the diode is well insulated from any other neighbouring diodes, which prevents light interactions between the neighbouring diodes.

Finally, the dielectric portions present against the side walls of the second semi-conductor portion and the first part of the first semi-conductor portion produce a passivation of said side walls.

The first semi-conductor portion may be n-doped and the second semi-conductor portion may be p-doped, whereby the first electrode may form a cathode of the diode and whereby the second electrode may form an anode of the diode.

The diode may further comprise a dielectric mask such that a first part of the second electrode is arranged between the dielectric mask and the second semi-conductor portion, that at least one second part of the second electrode may be arranged in at least one opening passing through the dielectric mask, and that the dielectric portions may cover the side walls of the dielectric mask.

In such a case, upper faces of the dielectric mask, of the dielectric portions and of the first and second electrodes can jointly form a substantially planar continuous surface of the diode. Said substantially planar continuous surface allows the diode to be easily hybridised, for example without using inserts such as connecting microbeads, with another element such as a substrate for producing different diode connection configurations and capable of further comprising a planar face at which materials similar to those of the diode can be found, for example by direct metal-to-metal bonding (for the electrodes) and direct dielectric-to-dielectric bonding (for the dielectric portions and the dielectric mask). Said substantially planar continuous surface is also well suited for the production of an interconnect structure directly on the electrodes, thus overcoming a wide range of difficulties linked to the residual topology of the structures of the diodes in the prior art.

The upper faces of the dielectric mask, of the first and second electrodes and of the dielectric portions form a substantially planar continuous surface, i.e. they are positioned substantially along the same plane. The expression "substantially planar" is used herein to describe the fact that the surface formed by the upper faces of the dielectric mask, of the electrodes and of the dielectric portions can have variations in height or thickness, lying in the range of about 0 to 150 nm. These slight variations in height or thickness can originate from the implementation of chemical mechanical planarisation (CMP), taking place in the presence of the materials of the electrodes, the dielectric mask and the dielectric portions, the etching speeds of said different materials being different from one another. These slight variations in height or thickness, between the upper faces of the dielectric portions, of the dielectric mask and those of the electrodes, can have the advantage of guaranteeing excellent insulation between the electrodes of the diode and/or relative to electrodes of adjacent diodes when hollows are formed at the upper faces of the electrodes.

Outer side walls of the dielectric portions may be aligned with the side walls of the second part of the first semi-conductor portion. This configuration eases the production of the first electrode and furthermore optimises the overall dimensions of the structure formed by the semi-conductor portions and the dielectric portions.

The first semi-conductor portion may comprise a stack of at least two doped semi-conductors according to different conductivity levels. For example, when the first semi-conductor portion is n-doped, it may comprise a stack of a first n+doped semi-conductor arranged on the substrate and a second n–doped semi-conductor arranged on the first semi-conductor.

The thickness of the first semi-conductor portion advantageously lies in the range 2 µm to 4 µm approximately. Such a thickness can be obtained since the first semi-conductor portion is arranged directly on the substrate, without the presence of a dielectric layer between the first semi-conductor portion and the substrate. This thickness provides for a very good electrical contact between the first semi-conductor portion and the first electrode only by the side walls of the first semi-conductor portion, without having to produce a horizontal contact surface (parallel to the main plane of the substrate) to form the electrical connection between the first electrode and the first semi-conductor portion. Such a thickness of the first semi-conductor portion further allows for the implementation of the removal of the substrate by laser (laser lift-off), even though no dielectric layer is inserted between the substrate and the first semi-conductor portion, whereby such a removal operation can be implemented after hybridisation of the electrodes of the diode on an interconnect substrate.

The diode may be a photodiode or an LED.

In such a case, the photodiode may comprise at least one intrinsic semi-conductor portion arranged between the first and second semi-conductor portions and such that side walls of the intrinsic semiconductor portion are covered by the dielectric portions, or the LED may comprise at least one active emitting area at at least one quantum well arranged between the first and second semi-conductor portions and such that side walls of the active emitting area are covered by the dielectric portions.

The diode may further comprise an interconnect substrate on which the diode is arranged and to which the first and second electrodes of the diode are electrically connected. Said interconnect substrate can therefore be arranged at the rear face of the diode, i.e. the face at which the two electrodes of the diode are located.

The invention further relates to an electronic device comprising a plurality of diodes as described hereinabove, wherein each of the first electrodes is furthermore electrically connected to the first semi-conductor portion of at least one neighbouring diode only by a contact with the side walls of the second part of the first semi-conductor portion of said at least one neighbouring diode. The integration of the diodes is thus maximised within the electronic device since the first electrodes can fill the spaces between two neighbouring diodes.

The first electrodes of the diodes of the device may form a cathode common to said diodes.

The diodes may form a part of an array of diodes of similar structures forming a pixel array of the electronic device.

A method for producing a diode is also described, comprising at least the steps of:
  producing, on a substrate, a stack of layers comprising at least first and second doped semi-conductor layers according to opposite types of conductivity, such that the first semi-conductor layer is arranged between the second semi-conductor layer and the substrate, and comprising at least one electrically conducting layer arranged on the second semi-conductor layer;
  performing a first etching of the stack of layers through the electrically conducting layer, the second semi-conductor layer and a part of the thickness of the first semi-conductor layer, forming a first part of the second electrode, a second semi-conductor portion and a first part of a first semi-conductor portion;
  producing dielectric portions covering side walls of the first part of the second electrode, the second semi-conductor portion and the first part of the first semi-conductor portion;
  performing a second etching of the stack of layers through a remaining thickness of the first semi-conductor layer as far as the substrate, forming a second part of the first semi-conductor portion arranged between the first part of the first semi-conductor portion and the substrate, the first and second semi-conductor portions forming a p-n junction;
  producing a first electrode resting on the substrate and arranged against the dielectric portions and side walls of the second part of the first semi-conductor portion, the first electrode being electrically connected to the first semi-conductor portion only by a contact with the side walls of the second part of the first semi-conductor portion, and producing a second part of the second electrode on the first part of the second electrode.

The invention further proposes a method for producing a light-emitting diode or light-receiving diode, comprising at least the steps of:
  producing a stack of layers comprising at least first and second doped semi-conductor layers according to opposite types of conductivity and at least one electrically conducting and optically reflecting layer, such that the second semi-conductor layer is arranged between the first semi-conductor layer and the electrically conducting and optically reflecting layer;
  performing a first etching of the stack of layers through the electrically conducting, layer, the second semi-conductor layer and a part of the thickness of the first semi-conductor layer, forming a first part of a second electrode of the diode, a second semi-conductor portion and a first part of a first semi-conductor portion through which a light is intended to be emitted or received by the diode;

producing dielectric portions covering side walls of the first part of the second electrode, the second semi-conductor portion and the first part of the first semi-conductor portion;

performing a second etching of the stack of layers through a remaining thickness of the first semi-conductor layer, forming a second part of the first semi-conductor portion such that the first part of the first semi-conductor portion is arranged between the second part of the first semi-conductor portion and the first part of the second electrode, the first and second semi-conductor portions forming a p-n junction;

producing a first electrode arranged against outer side walls of the dielectric portions and against side walls of the second part of the first semi-conductor portion, the first electrode being electrically connected to the first semi-conductor portion only by a contact with the side walls of the second part of the first semi-conductor portion and passing through the entire thickness of the first semi-conductor portion, and producing a second part of the second electrode on the first part of the second electrode.

Given that the dielectric portions are deposited on the side walls of the etched structure in the stack of layers, said dielectric portions can be produced by a self-aligned method allowing the insulation of the electrodes of the diode without using a mask specially designed to produce said dielectric portions, for example via a conformal deposition suited to the material of the dielectric portions, followed by an etching of the portions of said material that do not cover the side walls of the structures.

The first etching of the stack of layers may be implemented through a dielectric mask arranged on the stack of layers, and the dielectric portions may cover side walls of the dielectric mask.

The second etching of the stack may take place such that outer side walls of the dielectric portions are aligned with the side walls of the second part of the first semi-conductor portion.

The production of the first electrode and of the second part of the second electrode may comprise the implementation of the steps of:

producing an opening through the dielectric mask and opening out onto the first part of the second electrode;

depositing at least one electrically conducting material into the opening and in a space formed through the stack of layers by the implementation of first and second etchings;

planarising the electrically conducting material with a stop on the dielectric mask.

The production of electrodes corresponds in such a case to the implementation of a "damascene"-type method, wherein one or more electrically conducting materials are formed by at least one full wafer deposition, i.e. a deposition of the electrically conducting material on the entirety of the structure produced, whereby the electrodes are then obtained by planarisation of said electrically conducting material. The production of the first electrode therefore does not require any specific alignment or masking step. The location of the first electrode may correspond to a space formed between the dielectric portions covering the side walls of two neighbouring diodes.

The stack of layers may be produced on an initial substrate such that the first semi-conductor layer is arranged between the second semi-conductor layer and the initial substrate. The initial substrate can in particular be used for the growth of the semi-conductor layers of the stack.

The method may further comprise, after producing the first electrode and the second part of the second electrode, a step of transferring the diode onto an interconnect substrate such that the first and second electrodes of the diode are electrically connected to the interconnect substrate, then a step of removing the initial substrate.

The invention further relates to a method for producing an electronic device comprising the implementation of a method as described hereinabove, wherein the implementation steps form a plurality of diodes such that each of the first electrodes is electrically connected to the first semi-conductor portion of at least one neighbouring diode only by a contact with the, side walls of the second part of the first semi-conductor portion of said at least one neighbouring diode.

BRIEF DESCRIPTION OF THE FIGURES

This invention will be better understood after reading the following description of example embodiments, given for purposes of illustration only and not intended to limit the scope of the invention, and with reference to the accompanying figures, wherein.

Identical, similar or equivalent parts of the different figures described hereinbelow carry the same reference numerals in order to ease the passage from one figure to another.

The different parts shown in the figures are not necessarily displayed according to a uniform scale in order to make the figures easier to read.

The different possibilities (alternatives and embodiments) must be understood as not being exclusive with regard to each other and can be combined with each other.

DETAILED DESCRIPTION OF THE SPECIFIC EMBODIMENTS

FIG. 1A to 1I show the steps of a method for producing an electronic device 100 according to one specific embodiment. In the specific embodiment described herein, the device 100 comprises a plurality of diodes 102 corresponding to electroluminescent diodes and forming an array of diodes used as a pixel array of the device 100. Alternatively, the diodes 102 may be produced beside one another without forming an array of diodes, without regular spaces therebetween.

Figure 1A:
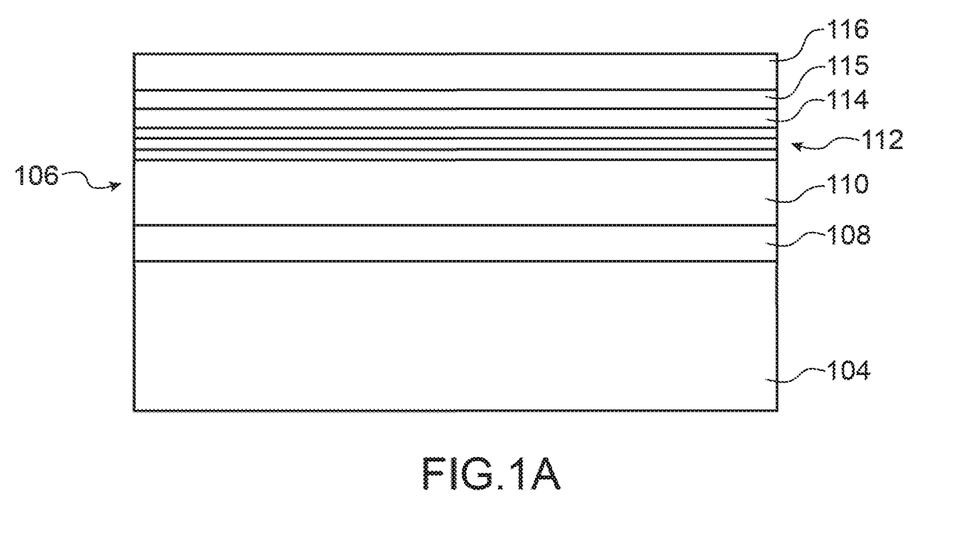
FIG. 1A to 1I show the steps of a method for producing an electronic device, subject-matter of the invention, comprising a plurality of diodes, also subject-matter of the invention, according to one specific embodiment.

As shown in FIG. 1A, the device 100 comprises an initial substrate 104, for example containing sapphire, silicon, a semi-conductor similar to that used to form the active part of the diodes 102, or any other material allowing the substrate 104 to form a growth substrate allowing for the deposition of the semi-conductor stack to form the active part of the diodes 102. The substrate 104 is used as a carrier for the deposition or growth of layers intended for the production of the diodes 102 of the device 100.

A first doped semi-conductor layer 106 according to a first type of conductivity, for example n-type conductivity, is deposited on the substrate 104. In the specific embodiment described herein, said layer 106 corresponds to a stack of a plurality of separate semi-conductor layers, for example an n+doped semi-conductor layer 108 with a donor concentration for example between about $5.10^{17}$ and $5.10^{20}$ donors/cm$^3$ on which is arranged another n–doped semi-conductor layer 110 with a donor concentration for example between about $10^{17}$ and $5.10^{19}$ donors/cm$^3$. For example, the layer 108 may be a GaN layer and the layer 110 may be an InGaN layer. The thickness of the layer 108 is, for example, greater than about 100 nm, for example equal to about 3 μm, and that of the layer 110 lies, for example, in the range of about 5 nm to 500 nm. The overall thickness of the first layer 106, i.e. the sum of the thicknesses of the layers 108 and 110 lies, for example, in the range of about 20 nm to 10 μm, and preferably in the range of about 2 μm to 4 μm. The layer 108 in this case forms a buffer layer arranged between the layer 110 and the substrate 104 and is in particular used to filter the growth defects so that said defects do not reach the layer 110 used to form the p-n junctions of the diodes 102.

Alternatively, the layers 108 and 110 may be doped with the same n type doping level (as opposed to the case described hereinabove, where the layer 108 is n+doped and the layer 110 is n–doped). According to another alternative embodiment, the layer 106 may correspond to a single n doped semi-conductor layer, and with a donor concentration, for example, of between about $10^{17}$ and $5.10^{20}$ donors/cm$^3$, comprising, for example, GaN, and the thickness of which lies, for example, in the range of about 20 nm to 10 μm, and advantageously in the range of about 2 μm to 4 μm.

A stack 112 comprising one or more emitting layers, for example five, each of which is intended to form a quantum well in the diodes 102, said quantum well for example comprising InGaN, and each of which is arranged between two barrier layers, for example comprising GaN, is arranged on the first layer 106 (on the layer 110 in FIG. 1A). The stack 112 is formed of layers comprising intrinsic semi-conductor materials, i.e. materials that are not intentionally doped (having residual donor concentrations $n_{nid}$, for example, equal to about $10^{17}$ donors/cm$^{-3}$, or in the range of about $10^{15}$ to $10^{18}$ donors/cm$^3$). The thickness of the one or of each of the emitting layers is, for example, equal to about 3 nm, and more generally in the range of about 0.5 nm to 10 nm, and the thickness of each of the barrier layers is, for example, in the range of about 1 nm to 25 nm. The layers of the stack 112 are intended to form the active emitting layers of the diodes 102.

A second doped semi-conductor layer 114 according to a second type of conductivity, opposite that of the doping of the first layer 106 and therefore in this case, p-type conductivity, with an acceptor concentration, for example, of between about $10^{17}$ and $5.10^{19}$ acceptors/cm$^3$, is arranged on the stack 112. The layers 106 and 114 (and more particularly the layers 110 and 114 in the example described herein) are intended to form the p-n junctions of the diodes 102. The semi-conductor of the layer 114 is, for example, GaN and the thickness thereof lies, for example, in the range of about 20 nm to 10 μm.

In an alternative embodiment, an electron blocking layer (not shown in FIG. 1A to 1H) may be arranged between the second layer 114 and the stack of layers 112, said electron blocking layer comprising for example AlGaN with 12% aluminium and p-doped with an acceptor concentration that is, for example, equal to about $1.10^{17}$ acceptors/cm$^3$.

Materials different to those stipulated hereinabove can be used to produce the diodes 102.

An electrically conducting layer 115 intended to form a part of the electrode that will be in contact with the semi-conductor of the layer 114, is arranged on the layer 114. The electrically conducting material used is optically reflecting and corresponds, for example, to aluminium. This material is classed as optically reflecting as the layer 115 has an amplitude reflection coefficient (ratio of the amplitude of the reflected light to the amplitude of the incident light) of at least 80%.

A layer 116 intended to form a dielectric hard mask is produced on the layer 115. The material of said layer 116 is, for example, SiO$_2$.

Figure 1B:
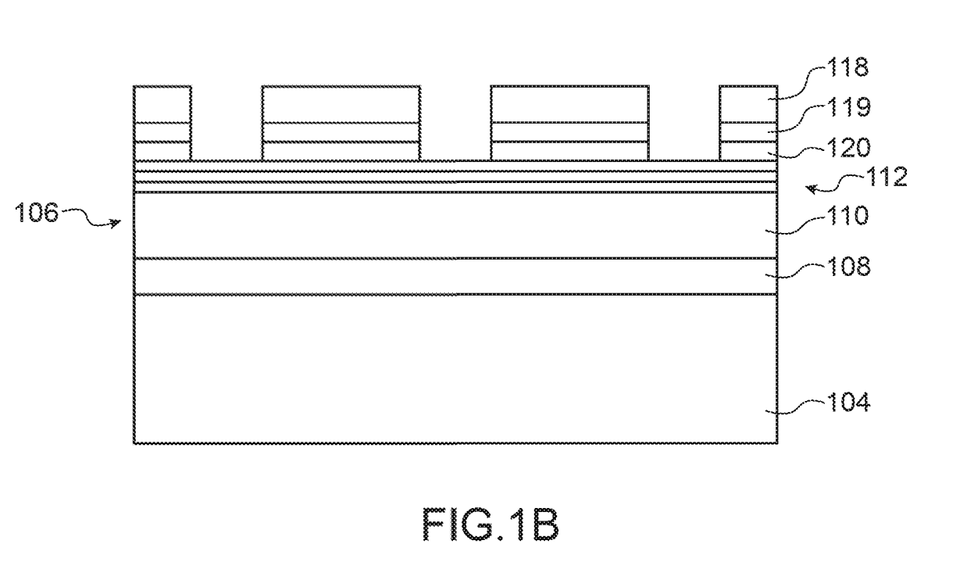

As shown in FIG. 1B, patterns are formed by etching in the layer 116, forming the dielectric mask 118. The openings formed in the dielectric mask 118 correspond to the patterns to be etched in the layers on which the dielectric mask 118 is arranged in order to define the mesa structures of the diodes 102. The electrically conducting layer 115 is etched according to the pattern of the dielectric mask 118, while preserving the remaining portions 119 of the layer 115 intended for form parts of the anodes of the diodes 102. The layer 114 is then etched according to the patterns defined by the dielectric mask 118, producing second doped semi-conductor portions 120 intended to form a part of the p-n junctions of the diodes 102. The layers 114, 115 and 116 are, for example, etched by the implementation of reactive-ion etching by a plasma torch system, or ICP-RIE (Inductively Coupled Plasma—Reactive Ion Etching).

Figure 1C:
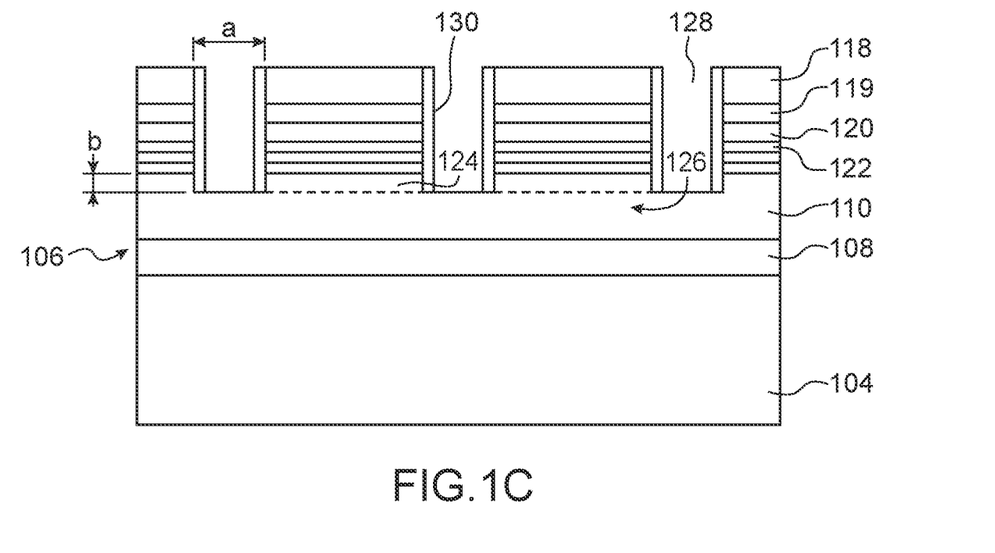

As shown in FIG. 1C, the etching is then extended into the stack 112 and a first part of the first layer 106 (or a first of the stack of layers forming the first layer 106), still according to the patterns defined by the dielectric mask 118. Said etching is stopped at a depth located in the first layer 106 such that a second part of the first layer 106 is preserved at the bottom of each of the etched zones of the stack. In the example described herein, the etching is stopped at a level located in the layer 110 such that the layer 108 and a part of the thickness of the layer 110 are not etched. The thickness, given the reference letter "b" in FIG. 1C, of the layer 110 that is etched, i.e. the thickness of the first part he first layer 106, lies for example, in the range of about 100 nm to 5 μm.

Alternatively, said etching can be stopped at the upper face of the layer 108 such that said layer 108 is not etched, but that the entire thickness of the layer 110 is etched. According to another alternative embodiment, said etching can be stopped at a level located in the layer 108 such that only a part of the thickness of the layer 108 is not etched.

The choice of the etching depth applied, and thus of the thickness of each of the first and second parts of the first layer 106, in particular depends on the initial thickness of the first layer 106 (and thus on the initial thicknesses of the layers 108 and 110 in the embodiment described herein), such that the remaining thickness of the first layer 106, i.e., the thickness of the second part of the first layer 106, is sufficient to produce a good electrical contact between said second part of the first layer 106 and the cathodes of the diodes 102 as described hereinbelow.

The remaining portions of the stack 112 form active areas 122 of the diodes 102 and the remaining portions of the first part of the first layer 106 form first parts 124 doped semi-conductor portions 126 intended to form, with the second portions 120, the p-n junctions of the diodes 102 (in FIG. 1C, the first parts 124 are symbolically delimited from the remainder of the first layer 106 by dotted lines).

The etchings performed in the layers 106 (108+110), 112, 114 and 115 correspond to the positions of the cathodes of the diodes 102 of the device 100. Said etching of said layers forms, between the mesa structures of the diodes 102, spaces 128 that are subsequently used to produce the cathodes of the diodes 102. In the specific embodiment described herein, the cathodes of the diodes 102 will form a cathode common to a plurality of diodes 102, or to all diodes 102, of the device 100.

One dimension, assigned the reference letter "a" in FIG. 1C, of the spaces 128 corresponding to the distance between two mesa structures of neighbouring diodes 102 is, for example, greater than or equal to about 50 nm, the minimum distance between two neighbouring diodes 102 being defined by the minimum resolution of the lithography implemented. Said dimension "a" corresponds to the sum of the width of a portion of electrically conducting material that will be produced between the two mesa structures of the diodes 102 to form a cathode common to said diodes 102 and thicknesses of two vertical dielectric portions that will also be arranged between the two mesa structures of the diodes 102. Therefore, the dimension "a" depends on the width of the cathode produced between the diodes 102, which is in particular chosen as a function of the acceptable losses linked to the electrical current supply in the areas the furthest from the peripheral plugs. The etching implemented is dry etching, for example using a $Cl_2$-based plasma or reactive-ion etching, for example ICP-RIE.

The dimensions of the sides of one of the mesa structures can lie in the range of about 500 nm to 1 mm, or in the range 500 nm to several millimeters, depending on the target applications. For applications using high-power diodes (for example LED bulbs to form car headlights), the dimensions of the diodes 102 will be greater than for applications using lower power diodes 102.

A dielectric layer, for example corresponding to a SiN/$SiO_2$ dual layer, and forming a passivation layer, is then deposited with a compliant thickness, for example in the range of about 5 nm to 1 μm and advantageously equal to about 200 nm, on the dielectric mask 118 and along the walls of the spaces 128, thus covering the side walls of the dielectric mask 118, of the second semi-conductor portions 120, of the active areas 122 and of the first parts 124 of the first semi-conductor portions 126. The dielectric layer is also deposited on the non-etched parts of the first layer 106 forming the bottom walls of the spaces 128. This dielectric layer is, for example, formed by a PECVD-type deposition (plasma enhanced chemical vapour deposition) or ALD-type deposition (atomic layer deposition) depending on the nature of the one or more materials deposited.

Anisotropic etching, for example dry etching such as RIE, is then implemented such that the parts of the dielectric layer located in the spaces 128 and not covering the side walls of the mesa structures of the diodes 102 are removed, thus revealing the parts of the first layer 106 located at the bottom of the spaces 128. The parts of said dielectric layer covering the upper faces of the dielectric mask 118 are also removed. Therefore, only portions 130 of the dielectric layer covering the side walls of the dielectric mask 118, of the second semi-conductor portions 120, of the active areas 122, and of the first parts 124 of the first semi-conductor portions 126 are preserved in the spaces 128.

Figure 1D:
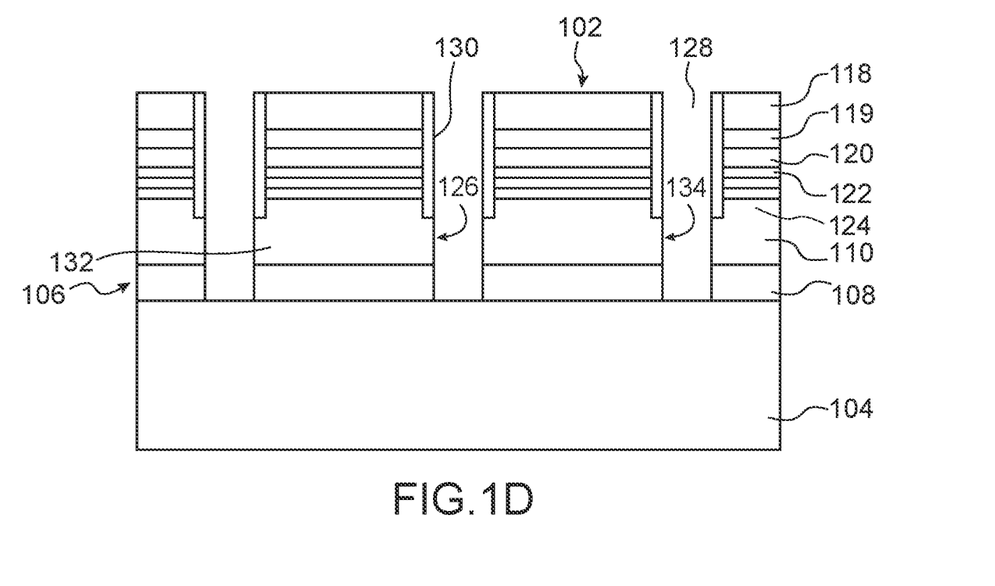

As shown in FIG. 1D, a second etching of the layer 106 then takes place until the bottom walls of the spaces 128 are formed by the substrate 104, i.e. through the entire thickness of the second part of the first layer 106, thus forming second parts 132 of the first semi-conductor portions 126 that include the remaining portions of the second part of the first layer 106. Said etching reveals side walls 134 of said second parts 134 of the first portions 126 that will form electrical contact areas for the cathodes of the diodes 102.

The portions of the dielectric mask 118, the semi-conductor portions 120 and 126, the active areas 122 and the dielectric portions 130 form mesa structures, i.e. stacks in the form of islands, arranged on the substrate 104. Each mesa structure of each diode 102 has a section that, in a plane parallel to the face of the substrate 104 on which said structures are at rest, takes on for example the shape of a disc. Each of the mesa structures can therefore form a cylindrical island. Mesa structures of a different shape can be considered for example a box shape.

Figure 1E:
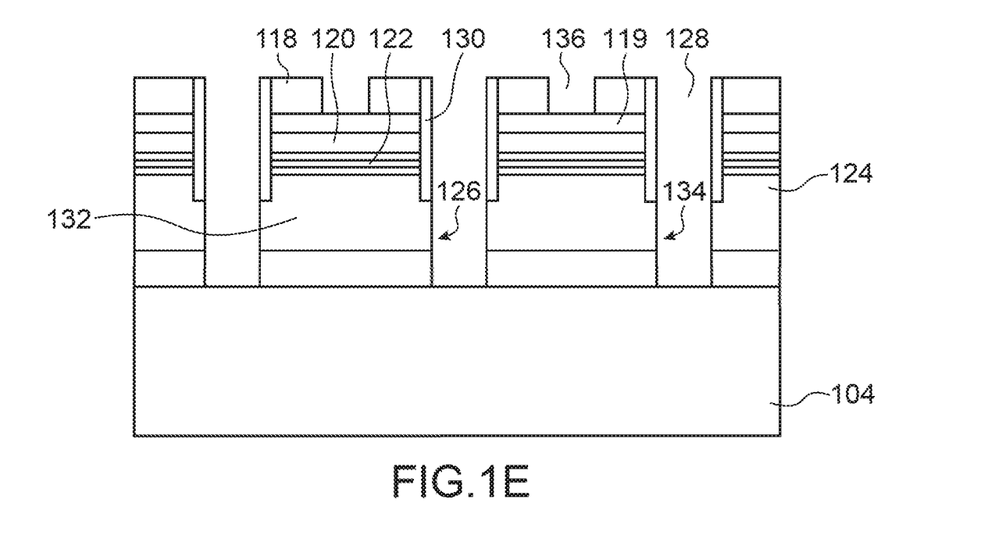

Openings 136 are then made through the dielectric mask 118, forming locations for the production of second parts of anodes of the diodes 102 (FIG. 1E). Said openings 136 pass through the entire thickness of the dielectric mask 118 such that the bottom walls of the openings 136 are formed by the portions 119. Said etching is, for example, ICP-RIE-type etching.

Figure 1F:
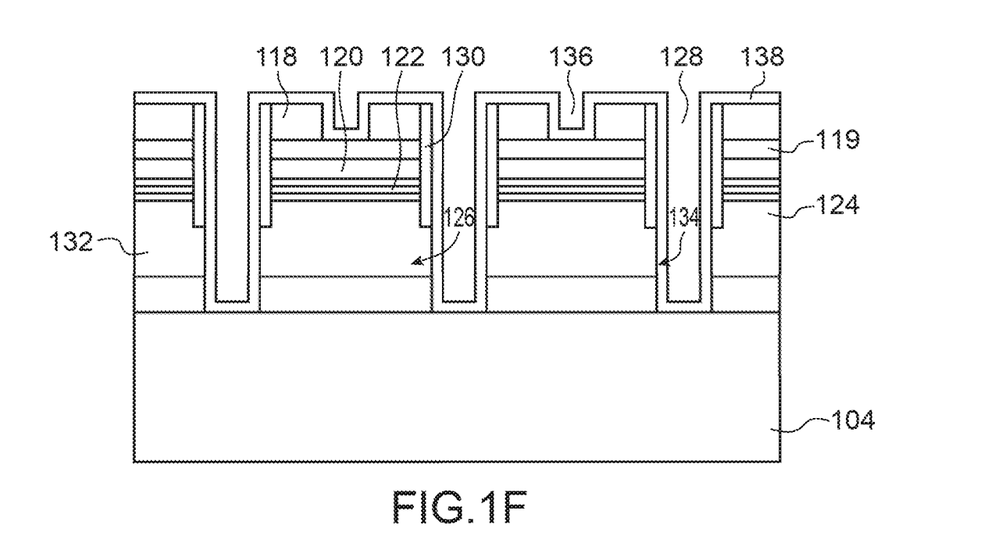

A first electrically conducting material 138 is then deposited in the spaces 128, between the mesa structures of the diodes 102, as well as on the upper faces of the dielectric mask 118 and in the openings 136 (FIG. 1F). Said first electrically conducting material 138 is deposited in a compliant manner, i.e. by forming a layer, the thickness whereof is substantially constant, on the dielectric mask 118 and along the walls of the spaces 128 and of the openings 136. In the example embodiment described herein, the first electrically conducting material 138 is formed by the deposition of a first layer of titanium, the thickness whereof lies, for example, in the range of about 5 nm to 300 nm, followed by a deposition of a second layer of aluminium, the thickness whereof lies, for example, in t range of about 50 nm to 1 μm.

The first electrically conducting material 138 is in electrical contact with the side walls 134 of the second parts 134 of the first portions 126, and with the portions 119 at the bottom walls of the openings 136. Said electrical contacts are intended to form electrical connections between the p-n junctions and the anodes and cathodes of the diodes 102.

Figure 1G:
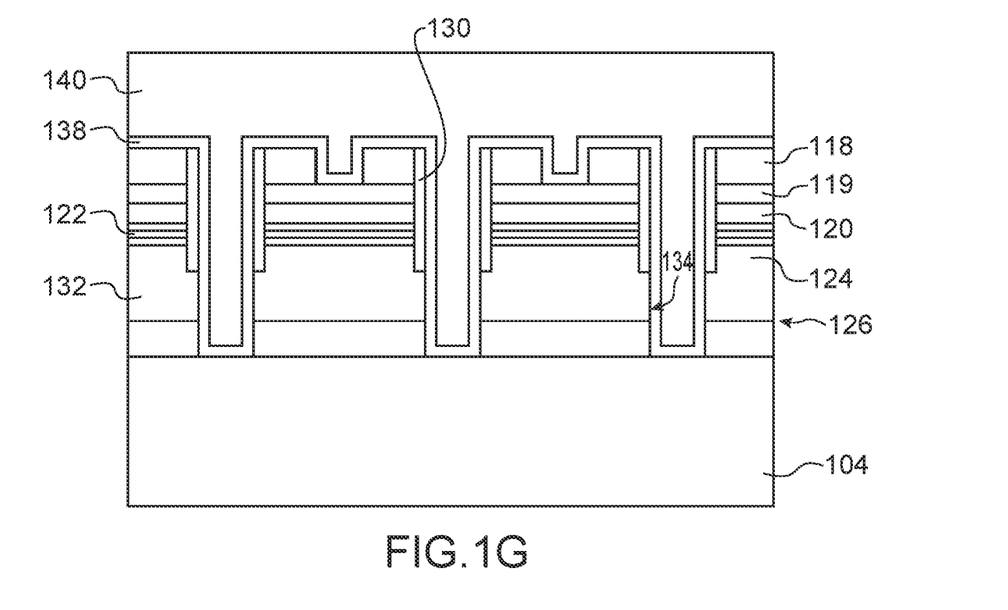

As shown in FIG. 1G, a second electrically conducting material 140 is deposited by filling the remaining volume in the spaces 128 and the openings 136. In FIG. 1G, the thickness of said second electrically conducting material 140 is such that it also covers the parts of the first electrically conducting material 138 arranged on the dielectric mask 118. The second electrically conducting material 140 is, for example, copper that can be formed by the implementation of full wafer electro-chemical deposition (ECD), i.e. over the entire structure previously produced.

Figure 1H:
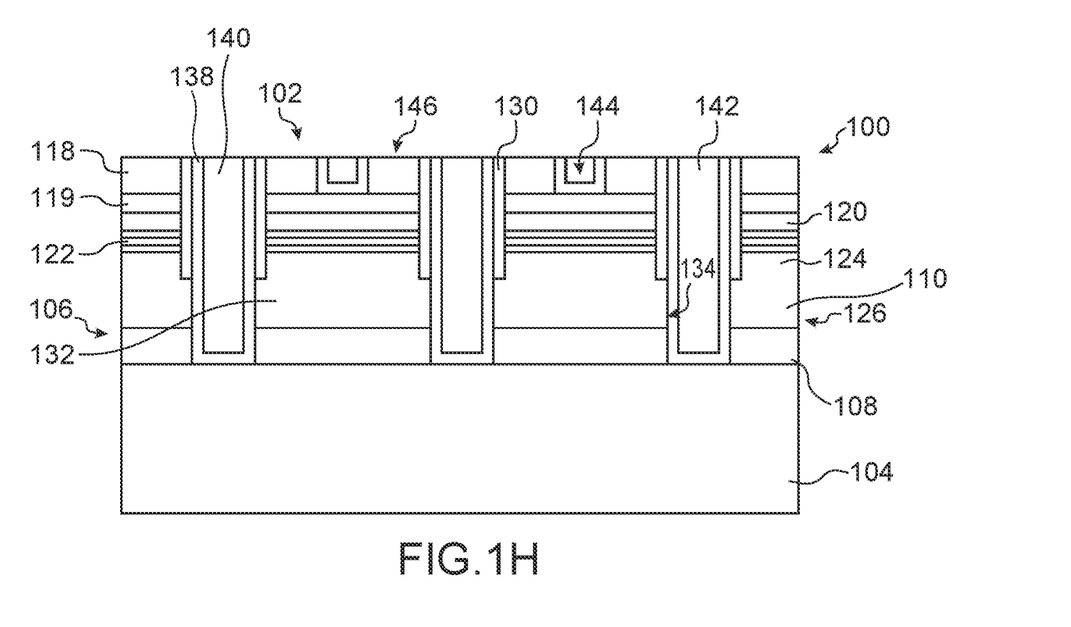

Finally, the diodes 102 of the device 100 are completed by performing chemical-mechanical planarisation (CMP) in order to remove the portions of the first and second electrically conducting materials 138 and 140 that protrude from the spaces 128 and the openings 134 and that are deposited on the dielectric mask 118. Said planarisation is used to electrically insulate the portions of conductive material arranged in the spaces 128 relative to those arranged in the openings 136 (FIG. 1H). The portions of electrically conducting materials 138 and 140 arranged in the spaces 128 form cathodes 142 extending throughout the height of the mesa structures of the diodes 102 and are electrically connected to the first semi-conductor portions 126 only at the side walls 134. The portions of electrically conducting materials 138 and 140 arranged in the openings 136 form second parts of the anodes 144 electrically connected to the portions 119 corresponding to the first parts of the anodes 144, the anodes 144 being connected to the second semi-conductor portions 120 at the upper faces of said portions 120. A face 146 of the device 100 produced is obtained, and is substantially planar, formed by the upper faces of the cathodes 142, of the anodes 144, of the dielectric portions 130 and of the dielectric mask 118. Said face 146 forms the rear faces of the diodes 102 at which electrical connections with the cathodes 142 and anodes 144 will be made.

Thanks to the vertical dielectric portions 130, the cathodes 142 are electrically well insulated from the second semi-conductor portions 120, from the anodes 144 and from the active areas 122. The thickness of the dielectric portions 130, which corresponds to the thickness of the dielectric layer used to produce the portions 130, can be chosen such that an acceptable leakage current is tolerated on each of the diodes 102, for example of less than 1% of the nominal current passing through the diode 102, when they are subjected to a potential difference (applied between the cathode and the anode), for example of about 4 Volts. The minimum thickness of the dielectric portions 130 lies, for example, in the range of about 3 nm to 5 nm, or in the range 3 nm to 4 nm, depending on the one or more materials used to produce the dielectric portions 130.

In order to guarantee electrical insulation between the cathodes 142 and the anodes 144 of the diodes 102, and to prevent the presence of parts of the electrically conducting materials 138 and 140 electrically connecting one or more cathodes 142 with one or more anodes 144, the planarisation step is advantageously implemented until overetching of the portions of electrically conducting materials 138 and 140 arranged in the spaces 128 and in the openings 136 relative to the dielectric materials of the portions 130 and of the mask 118, forming hollows in the cathodes 142 and anodes 144 at the upper faces of said electrodes. Said hollows can have a depth, relative to the plane of the upper face 146, that lies in the range of about 5 nm to 150 nm. Said overetching can be obtained by modifying the etching anisotropy and thanks to the etching selectivity that exists between the dielectric materials of the portions 130 and of the mask 118 and the electrically conducting materials 138 and 140. The CMP performed has a different abrasion speed depending on the materials, and in the method described herein, the abrasion of the electrically conducting materials 138 and 140 is faster than that of the dielectric materials of the portions 130 and of the mask 118. This results in a removal of the materials 138 and 140 at the upper face 146 of the device 100, said removal taking place relative to the dielectric portions 130 and the dielectric mask 118. Therefore, the electrodes of the diodes 102 remain perfectly insulated from one another thanks to an intrinsic property of the planarisation implemented. Such overetching can also be implemented by an RIE method.

In the specific embodiment described hereinabove, the first semi-conductor portions 126 are n type portions and the second semi-conductor portions 120 are p type portions. Alternatively, the first semi-conductor portions 126 can be p type portions and the second semi-conductor portions 120 can be n type portions where, in such a case, the portions of electrically conducting material arranged in the spaces 128 form the anodes of the diodes 102 and the portions of electrically conducting material arranged in the openings 136 form, with the portions 119, the cathodes of the diodes 102.

The substantially planar surface obtained at the upper face 146 of the device 100 facilitates the hybridisation of the array of diodes 102 produced for all types of elements such as an electronic circuit, and in particular allows such hybridisation to take place by direct bonding (also known as bonding by molecular adhesion) of the array of diodes 102 to the electronic circuit without the use of inserts, such as microbeads, between the array of diodes 102 and the electronic circuit. The direct metal-to-metal and dielectric-to-dielectric type bondings taking place in such a case have the advantage of being sealed. The fact that hollows are present at the upper faces of the cathodes 142 and of the anodes 144 does not create any problems with regards to the implementation of such a direct bonding as, during said direct bonding, the materials of said portions become dilated and a very good contact can thus be obtained between said electrodes and conducting elements of the electronic circuit. Details concerning the implementation of such a direct bonding are, for example, disclosed in the document entitled "Mechanisms of copper direct bonding observed by in-situ and quantitative transmission electron microscopy" by M. Martinez et al., Thin Solid Films 530 (2013) 96-99.

Figure 1I:
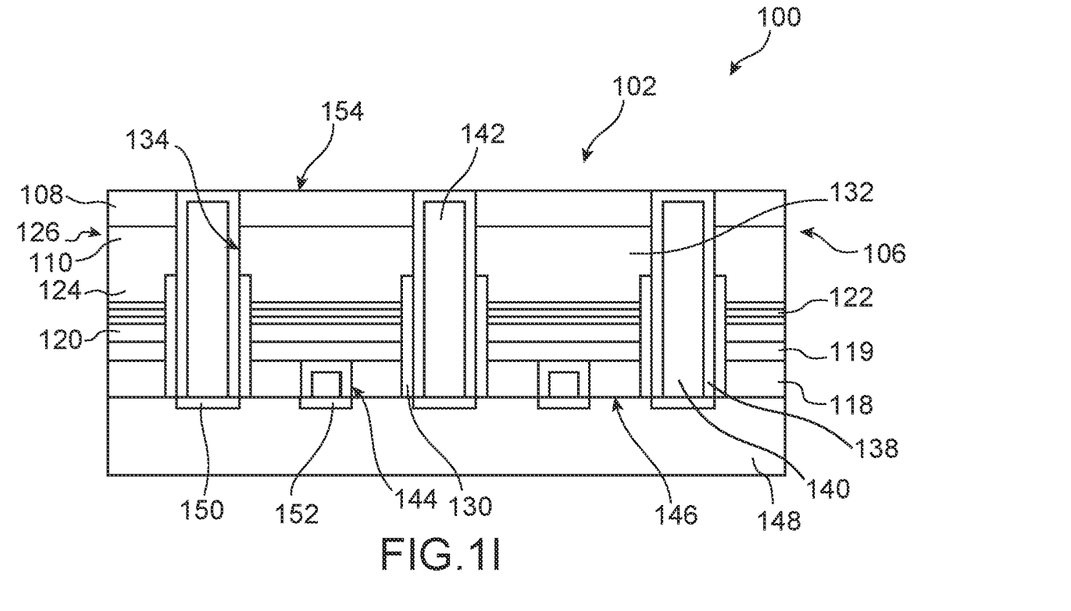

As shown in FIG. 11, the array of diodes 102 is transferred, at the upper face 146 thereof, onto an interconnect substrate 148 comprising electrical contacts 150 and 152 to which the cathodes 142 and the anodes 144 can be electrically connected, for example by direct bonding as described hereinabove. Said interconnect substrate 148 can correspond to an electronic circuit onto which the array of diodes 102 is transferred.

After said transfer, the initial substrate 104 can be removed, thus revealing a front face 154 of the diodes through which the light is intended to enter or leave. The type of removal operation performed can in particular depend on the nature of the initial substrate 104. For example, in the case of an initial substrate 104 made of sapphire, the latter can be removed by lift-off. The initial substrate 104 can also be removed by grinding or by selective etching.

Since the front face 154 is revealed by no longer being covered by the substrate 104, light-extraction patterns can be produced on said front face 154, if the diode 102 corresponds to a light-emitting diode, said patterns allowing the quantity of light emitted by the diode 102 to be increased. For this purpose, after having removed the initial substrate 104, a surface treatment can take place on the front face 154 allowing light extraction to be improved via refractive or diffractive phenomena. In the case of refractive phenomena, a random roughness of the surface of the front face 154 can be created by chemical attack, for example using KOH. Said roughness can correspond to random patterns of dimensions, in all directions, lying in the range 100 nm to 2 µm. In the case of diffractive phenomena, organised patterns can be created, having very small dimensions, for example lying in the range of about 50 nm to 500 nm. Regardless of whether the patterns produced are of the refractive or diffractive type, a silicone globe can be added for collecting the light and protecting the surface of the front face 154.

In the specific embodiment described herein, the device 100 comprises an array of diodes 102 that are electroluminescent diodes, the microelectronic device capable of forming a part of an LED display device (screens, projector, video wall, etc.). Said array of diodes 102 comprises the cathodes 142 that form a cathode common to all diodes 102, and each diode 102 comprises an anode 144 used to perform the individual addressing of each of the diodes 102.

Alternatively, the microelectronic device 100 can comprise an array of diodes 102 that light-receiving diodes or photodiodes. In such a case, the stack of layers 112 arranged between the semi-conductor layers 106 and 114 that are respectively n and p doped can correspond to one or more intrinsic semi-conductor layers. Moreover, in this alternative embodiment, the anodes 144 and the cathodes 142 of the diodes 102 are not used to provide current to the diodes 102 but to collect the currents photogenerated by the diodes 102.

According to another alternative embodiment, regardless of whether the diodes 102 correspond to electroluminescent diodes or to photodiodes, the mesa structures of the diodes 102 cannot comprise layers between the doped semi-conductor portions 120 and 126 (corresponding to the active emitting areas or to the intrinsic semi-conductor portions), and the p and n doped semi-conductors are thus arranged directly against one another.

Alternatively, the device 100 can comprise, on the upper face 134 thereof, a connecting structure forming the electrical connections of the diodes 102 and comprising first electrically conducting elements electrically connected to the cathodes 142 of the diodes 102 and second electrically conducting elements electrically connected to the anodes 144 of the diodes 102. Said electrically conducting elements of such a connecting structure are electrically insulated from one another by dielectric elements, the dimensions of which, in the plane of the face 134, are at least equal to those of the dielectric portions 130 and of the hard mask 118 such that the electrically conducting elements do not form short-circuits between the electrodes of the diodes 102.

The invention claimed is:

1. A light-emitting or light-receiving diode, comprising:
    a first doped semi-conductor portion and a second doped semi-conductor portion together forming a p-n junction, a first part of the first doped semi-conductor portion being arranged between a second part of the first doped semi-conductor portion and the second doped semi-conductor portion;
    dielectric portions covering side walls of the second doped semi-conductor portion and the first part of the first doped semi-conductor portion;
    a first electrode arranged against outer side walls of the dielectric portions and against side walls of the second part of the first doped semi-conductor portion, being electrically connected to the first doped semi-conductor portion only by contact with the side walls of the second part of the first doped semi-conductor portion, and passing through an entire thickness of the first doped semi-conductor portion;
    a second optically reflecting electrode electrically connected to the second doped semi-conductor portion such that the second doped semi-conductor portion is arranged between the second optically reflecting electrode and the first doped semi-conductor portion; and
    wherein the light-emitting or light-receiving diode is configured such that a light can be emitted or received by the light-emitting or light-receiving diode through the first doped semi-conductor portion.

2. The light-emitting or light-receiving diode according to claim 1, further comprising a dielectric mask such that a first part of the second optically reflecting electrode is arranged between the dielectric mask and the second doped semi-conductor portion, at least one second part of the second optically reflecting electrode is arranged in at least one opening passing through the dielectric mask, and the dielectric portions cover side walls of the dielectric mask.

3. The light-emitting or light-receiving diode according to claim 2, wherein upper faces of the dielectric mask, of the dielectric portions, of the first electrode, and of the second optically reflecting electrode, jointly form a substantially planar continuous surface of the light-emitting or light-receiving diode.

4. The light-emitting or light-receiving diode according to claim 1, wherein the outer side walls of the dielectric portions are aligned with the side walls of the second part of the first doped semi-conductor portion.

5. The light-emitting or light-receiving diode according to claim 1, wherein the first doped semi-conductor portion comprises a stack of at least two doped semi-conductors according to different conductivity levels.

6. The light-emitting or light-receiving diode according to claim 1, wherein a thickness of the first doped semi-conductor portion is in a range of 2 μm to 4 μm approximately.

7. The light-emitting or light-receiving diode according to claim 1, wherein the light-emitting or light-receiving diode is a photodiode or a LED.

8. The light-emitting or light-receiving diode according to claim 7,
    wherein the photodiode comprises at least one intrinsic semi-conductor portion arranged between the first doped semi-conductor portion and the second doped semi-conductor portion, such that side walls of the at least one intrinsic semi-conductor portion are covered by the dielectric portions, or
    wherein the LED comprises at least one active emitting area at at least one quantum well arranged between the first doped semi-conductor portion and the second doped semi-conductor portion, such that side walls of the at least one active emitting area are covered by the dielectric portions.

9. The light-emitting or light-receiving diode according to claim 1, further comprising an interconnect substrate on which the light-emitting or light-receiving diode is arranged and to which the first electrode and the second optically reflecting electrode of the light-emitting or light-receiving diode are electrically connected.

10. An electronic device, comprising:
    a plurality of light-emitting or light-receiving diodes according to claim 1,
    wherein each of the first electrodes in said plurality is further electrically connected to the first doped semi-conductor portion of at least one neighboring diode only by contact with the side walls of the second part of the first doped semi-conductor portion of the at least one neighboring diode.

11. The electronic device according to claim 10, wherein the plurality of the light-emitting or light-receiving diodes belong to an array of diodes of similar structures forming a pixel array of the electronic device.

12. A method for producing a light-emitting or light-receiving diode, comprising:
    producing a stack of layers comprising at least a first doped semi-conductor layer and a second doped semi-conductor layer according to opposite types of conductivity and at least one electrically conducting and optically reflecting layer, such that the second doped semi-conductor layer is arranged between the first doped semi-conductor layer and the at least one electrically conducting and optically reflecting layer;
    performing a first etching of the stack of layers through the at least one electrically conducting and optically reflecting layer, the second doped semi-conductor layer, and a part of a thickness of the first doped semi-conductor layer, forming a first part of a second electrode of the light-emitting or light-receiving diode, a second doped semi-conductor portion different from the second doped semi-conduc aver, a first part of a first doped semi-conductor portion different from the first doped semi-conductor layer and through which a light can be emitted or received by the light-emitting or light-receiving diode;

producing dielectric portions covering side walls of the first part of the second electrode, of the second doped semi-conductor portion, and of the first part of the first doped semi-conductor portion;

performing a second etching of the stack of layers through a remaining thickness of the first doped semi-conductor layer, forming a second part of the first doped semi-conductor portion such that the first part of the first doped semi-conductor portion is arranged between the second part of the first doped semi-conductor portion and the first part of the second electrode, the first doped semi-conductor portion and the second doped semi-conductor portion together forming a p-n junction; and producing a first electrode arranged against outer side walls of the dielectric portions and against side walls of the second part of the first doped semi-conductor portion, the first electrode being electrically connected to the first doped semi-conductor portion only by contact with the side walls of the second part of the first doped semi-conductor portion, and passing through an entire thickness of the first doped semi-conductor portion, and producing a second part of the second electrode on the first part of the second electrode.

13. The method according to claim 12,
wherein the first etching of the stack of layers is implemented through a dielectric mask arranged on the stack of layers, and
wherein the dielectric portions cover side walls of the dielectric mask.

14. The method according to claim 13, wherein the second etching of the stack of layers is implemented such that the outer side walls of the dielectric portions are aligned with the side walls of the second part of the first doped semi-conductor portion.

15. The method according to claim 13, wherein the producing of the first electrode and of the second part of the second electrode comprises:
producing an opening through the dielectric mask that opens out onto the first part of the second electrode;
depositing at least one electrically conducting material into the opening and in a space formed through the stack of layers by the performing of the first etching and of the second etching; and
planarizing the at least one electrically conducting material with a stop on the dielectric mask.

16. The method according to claim 12, wherein the stack of layers is produced on an initial substrate such that the first doped semi-conductor layer is arranged between the second doped semi-conductor layer and the initial substrate.

17. The hod according to claim 16, further comprising, after the forming of the first electrode and the producing of the second part of the second electrode, transferring the light-emitting or light-receiving diode onto an interconnect substrate such that the first electrode and the second electrode of the light-emitting or light-receiving diode are electrically connected to the interconnect substrate, and then removing the initial substrate.

18. A method for producing an electronic device comprising the method according to claim 12, wherein implementation of the method forms a plurality of light-emitting or light-receiving diodes such that each of the first electrodes in said plurality is electrically connected to the first doped semi-conductor portion of at least one neighboring diode only by contact with the side walls of the second part of the first doped semi-conductor portion of the at least one neighboring diode.

* * * * *